(12) United States Patent
Okumura

(10) Patent No.: US 9,031,260 B2
(45) Date of Patent: May 12, 2015

(54) ELECTRONIC MUSICAL APPARATUS HAVING A PLAYBACK CONTROL CIRCUIT

(75) Inventor: Takahiro Okumura, Shizuoka-ken (JP)

(73) Assignee: Yamaha Corporation (JP)

( * ) Notice: Subject to any disclaimer, the term of this patent is extended or adjusted under 35 U.S.C. 154(b) by 617 days.

(21) Appl. No.: 12/646,549

(22) Filed: Dec. 23, 2009

(65) Prior Publication Data

US 2010/0166220 A1    Jul. 1, 2010

(30) Foreign Application Priority Data

Dec. 26, 2008    (JP) ................. 2008-332034

(51) Int. Cl.
*H03G 5/00* (2006.01)
*H04R 5/04* (2006.01)
*H03G 5/16* (2006.01)

(52) U.S. Cl.
CPC . *H04R 5/04* (2013.01); *H03G 5/165* (2013.01)

(58) Field of Classification Search
CPC ..... G10H 1/06; G10H 2250/055; H04R 5/04; H03G 5/165
USPC ........... 381/98, 99, 101; 341/144; 84/600, 13, 84/7.661, 659, 647, 603, 622
See application file for complete search history.

(56) References Cited

U.S. PATENT DOCUMENTS

| | | | | |
|---|---|---|---|---|
| 4,243,840 A | * | 1/1981 | Kates | 381/99 |
| 4,888,811 A | * | 12/1989 | Takashi | 381/111 |
| 5,410,605 A | * | 4/1995 | Sawada et al. | 381/71.14 |
| 5,714,918 A | * | 2/1998 | Menkhoff | 333/28 R |
| 6,636,170 B1 | * | 10/2003 | Dijkmans | 341/144 |
| 2007/0121964 A1 | * | 5/2007 | Rumreich | 381/99 |
| 2007/0127738 A1 | | 6/2007 | Yamada et al. | |

FOREIGN PATENT DOCUMENTS

| | | |
|---|---|---|
| JP | 06-054395 | 2/1994 |
| JP | 07162985 A | 6/1995 |
| JP | 10-13999 A | 1/1998 |
| JP | 2000-307385 A | 11/2000 |
| JP | 2005-184040 A | 7/2005 |

OTHER PUBLICATIONS

Yamaha Corporation, "Frequency Dividing Network: Owner's Manual F1030" 1976.
Japanese Reason for Rejection issued in Japanese counterpart application No. JP2008-332034 dated Aug. 13, 2013. English translation provided.

* cited by examiner

*Primary Examiner* — Vivian Chin
*Assistant Examiner* — Con P Tran
(74) *Attorney, Agent, or Firm* — Rossi, Kimms & McDowell LLP

(57) ABSTRACT

A band division apparatus obtains an analog low-band signal, an analog intermediate-band signal and an analog high-band signal from a digital sound signal. In the band division apparatus, a digital filter separates the digital sound signal into a digital intermediate-band signal having the intermediate frequency band while the high frequency band and the low frequency band are attenuated, and a digital low-high-band signal having a frequency band combining the low frequency band and the high frequency band while the intermediate frequency band are attenuated. A DA converter converts the digital low-high-band signal into an analog low-high-band signal. Another DA converter converts the digital intermediate-band signal into the analog intermediate-band signal. An analog filter separates the analog low-high-band signal into the analog low-band signal and the analog high-band signal.

5 Claims, 4 Drawing Sheets

ELECTRONIC MUSICAL APPARATUS HAVING A PLAYBACK CONTROL CIRCUIT

BACKGROUND OF THE INVENTION

1. Technical Field of the Invention

The present invention relates to a band division apparatus that is especially suitable for use in an electronic musical instrument or the like that requires high sound quality.

2. Description of the Related Art

A so-called multi-amp system is used for electronic musical instruments or other acoustic devices, especially for those which require high sound quality. When the multi-amp system is used, a musical sound signal is divided into signals of different bands. The signals of the different bands are amplified through respective amplifiers and the amplified signals are then emitted through respective speakers of the bands.

Example filtering characteristics of filters used for band division are described as follows with reference to FIG. 4 which is also used for a later description of an embodiment of the invention. As shown in FIG. 4, a musical sound signal is divided into signals of three bands, i.e., low, intermediate, and high bands, and the low and intermediate bands cross over at a crossover frequency f1, and the intermediate and high bands cross over at a crossover frequency f2. In this example, the filtering characteristics of the filters are adjusted such that the sum of gains of the filters is about "0 dB" at any frequency included in the bands of the musical sound signal.

Since the musical sound signal is first generated as a digital signal and is then converted into an analog signal through a DA converter, either an "analog stage" or a "digital stage" is conventionally selected as a band division location at which the musical sound signal is divided into bands. In the case where the "analog stage" is selected as the band division location, first, a digital signal is converted into an analog signal through one DA converter and the analog signal is then divided into bands, for example, through a channel divider described in Non-Patent Reference 1.

On the other hand, in the case where the "digital stage" is selected as the band division location, first, a digital signal is divided into bands, for example, through a digital filter and respective analog signals of the bands are then obtained through the same number of DA converters as the number of the bands. Accordingly, 3 DA converters are required when a musical sound signal is divided into three bands as shown in FIG. 4. A technology for band division at the digital stage in this manner is described, for example, in Patent Reference 1.

[Patent Reference 1] Japanese Patent Application Publication No. Heisei 6-54395

[Non-Patent Reference 1] "F1030 Manual", Yamaha Corporation, 1976

However, each of the above technologies has the following problems.

First, in the case where a musical sound signal is divided into bands at the analog stage, to construct a channel divider, there is a need to use parts, which are highly accurate and also have high stability to temperature change or temporal change, or a complicated circuit scheme, which is disadvantageous in terms of cost. This is because it is necessary to set the sum of gains of signals of two adjacent bands at any frequency around the crossover frequency to about "0 dB" and also to synchronize the phases of the signals of the two adjacent bands.

On the other hand, the same number of DA converters as the number of the bands is required in the case where a musical sound signal is divided into bands at the digital stage. However, if the number of required DA converters is increased, cost is increased, especially in the case of electronic musical instruments or the like which require high sound quality since such electronic musical instruments also require high quality DA converters.

SUMMARY OF THE INVENTION

The invention has been made in view of the above circumstances and it is an object of the invention to provide a band division apparatus that can be realized at a low price while maintaining signal quality.

The invention is characterized by the following configurations to achieve the above object. Here, elements in parentheses are only illustrative.

In accordance with the invention, there is provided a band division apparatus that obtains, from a digital sound signal having a predetermined frequency band (20 Hz to 20 kHz), an analog low-band signal which has a low frequency band (20 Hz to 280 Hz) and in which other bands have been attenuated, an analog intermediate-band signal which has an intermediate frequency band (280 Hz to 4 kHz) higher than the low frequency band and in which other bands have been attenuated, and an analog high-band signal which has a high frequency band (4 kHz to 20 kHz) higher than the intermediate frequency band and in which other bands have been attenuated. The inventive band division apparatus comprises a digital filter (50, 52) that separates the digital sound signal into a digital intermediate-band signal which has the intermediate frequency band and in which the high-band and low-bands have been attenuated and a digital low-high-band signal which has a frequency band combining the low and high bands and in which the intermediate band has been attenuated, a first DA converter (54) that converts the digital low-high-band signal into an analog low-high-band signal, a second DA converter (56) that converts the digital intermediate-band signal into an analog intermediate-band signal, and an analog filter (60, 62, 64) that separates the analog low-high-band signal into the analog low-band signal and the analog high-band signal.

In the invention, it is possible to reduce the number of DA converters since the digital low-high-band signal having a frequency band combining the low and high bands is generated and converted into an analog low-high-band signal. It is also possible to realize a band division apparatus at a low price while maintaining signal quality since the filter that separates the analog low-high-band signal into the analog low-band signal and the analog high-band signal can be implemented in a simple configuration.

DETAILED DESCRIPTION OF THE INVENTION

1. Hardware Configuration of Embodiment

A hardware configuration of an electric piano of an embodiment of the invention is described below with reference to FIG. 1.

Figure 1:
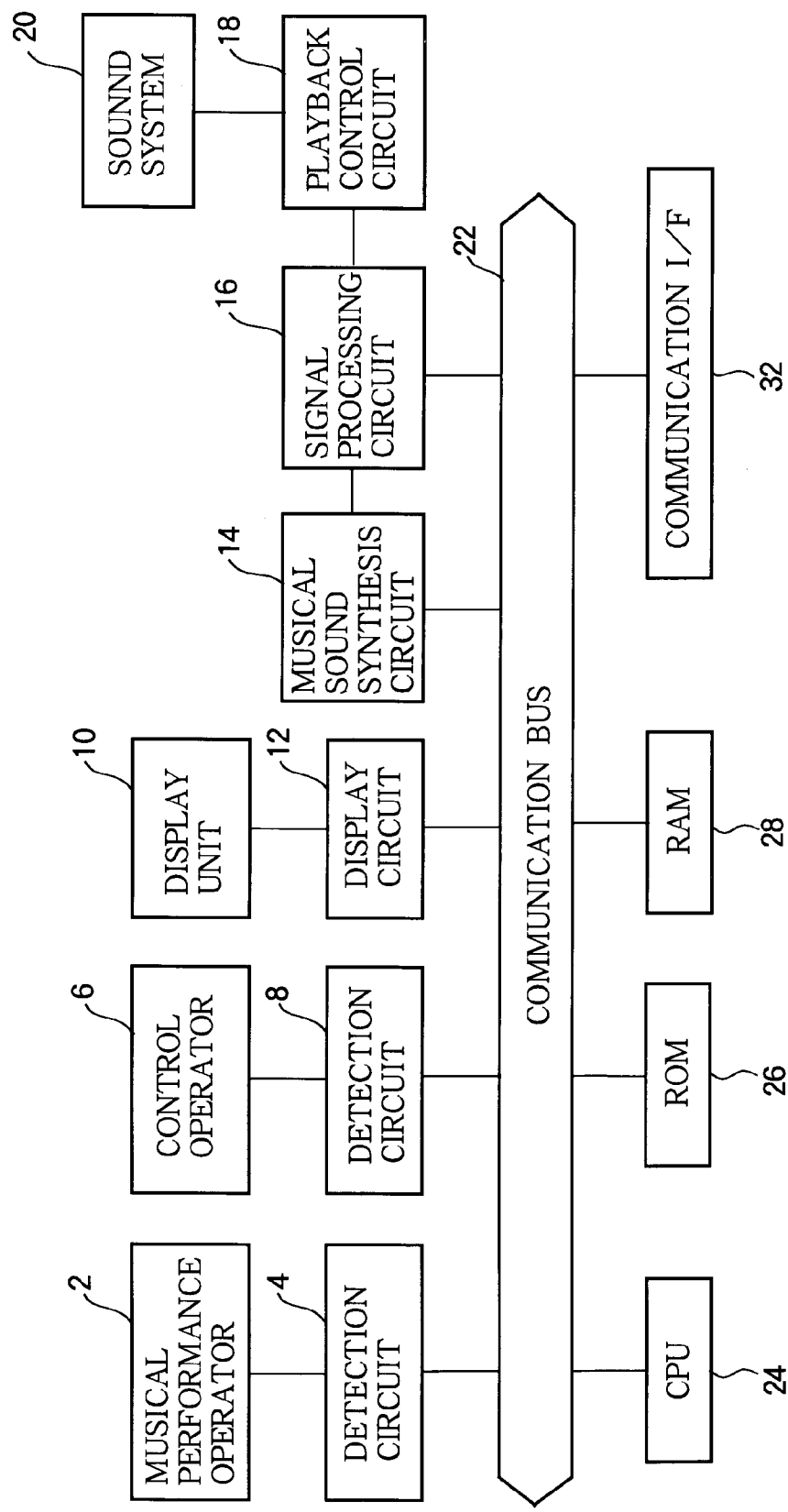
FIG. 1 is a block diagram of an electric piano of an embodiment of the invention.

In FIG. 1, reference numeral "2" denotes a musical performance operator including a keyboard, pedal, or the like, an operating state of which is detected by a detection circuit 4 and is output through a communication bus 22. Reference numeral "6" denotes a control operator which includes a variety of switches or the like and an operating state of which is detected by a detection circuit 8 and is output through the communication bus 22. Reference numeral "10" denotes a display unit which displays a variety of information to a user under control of a display circuit 12. Reference numeral "14" denotes a musical sound synthesis circuit which synthesizes a musical sound signal, which is a digital signal, based on musical performance information input to the musical sound synthesis circuit 14. Reference numeral 16 is a signal processing circuit which includes a DSP and a microprogram that operates on the DSP and which performs various digital signal processing such as equalization processing and band division processing on a musical sound signal output from the musical sound synthesis circuit 14. Reference numeral "18" denotes a playback control circuit which converts a musical sound signal which is a digital signal received from the signal processing circuit 16 into an analog signal and performs analog signal processing such as noise removal and band division on the analog musical sound signal using an analog circuit. Reference numeral "20" is a sound system which performs level adjustment of the analog musical sound signal received from the playback control circuit 18 and emits a corresponding sound. Reference numeral "24" denotes a CPU which controls the other components through the communication bus 22 according to a program stored in a ROM 26. Reference numeral "28" is a RAM which is used as a working memory of the CPU 24. Reference numeral "32" denotes a communication interface through which a MIDI signal or the like is input and output.

When one note-on event occurs, for example when a sound generation instruction is issued by means of the musical performance operator 2 or else, in the electric piano of this embodiment, the musical sound synthesis circuit 14 synthesizes four musical sound signals and four speaker systems mounted on a casing of the electric piano at four locations thereof simultaneously emit the four musical sound signals as a total single sound. Here, each of the speaker systems includes three speakers (i.e., a tweeter, a woofer, and a squawker). The speaker systems are mounted at a left portion, a right portion, a central front portion, and a central rear portion of the electric piano. Thus, the four musical sound signals have different waveforms corresponding to the mounting positions of the corresponding speaker systems. More specifically, musical sound signals are previously recorded as musical sound models using four microphones mounted on a casing of an acoustic piano at a left portion, a right portion, a central front portion, and a central rear portion thereof and four types of waveform data are previously created based on the recorded musical sound signals. The musical sound synthesis circuit 14, in which such waveform data is stored, synthesizes respective musical sound signals of the corresponding locations based on the waveform data. An entire frequency band of a digital musical sound signal in the musical sound synthesis circuit 14 and the signal processing circuit 16 is 20 Hz to 20 kHz. In the following description, a musical sound signal, which is synthesized at the musical sound synthesis circuit 14 and is then input to the signal processing circuit 16, is referred to as a "source musical sound signal". The source musical sound signal may include frequency components of the entire frequency band (20 Hz to 20 kHz).

2. Details of Band Division Processing

Figure 2:
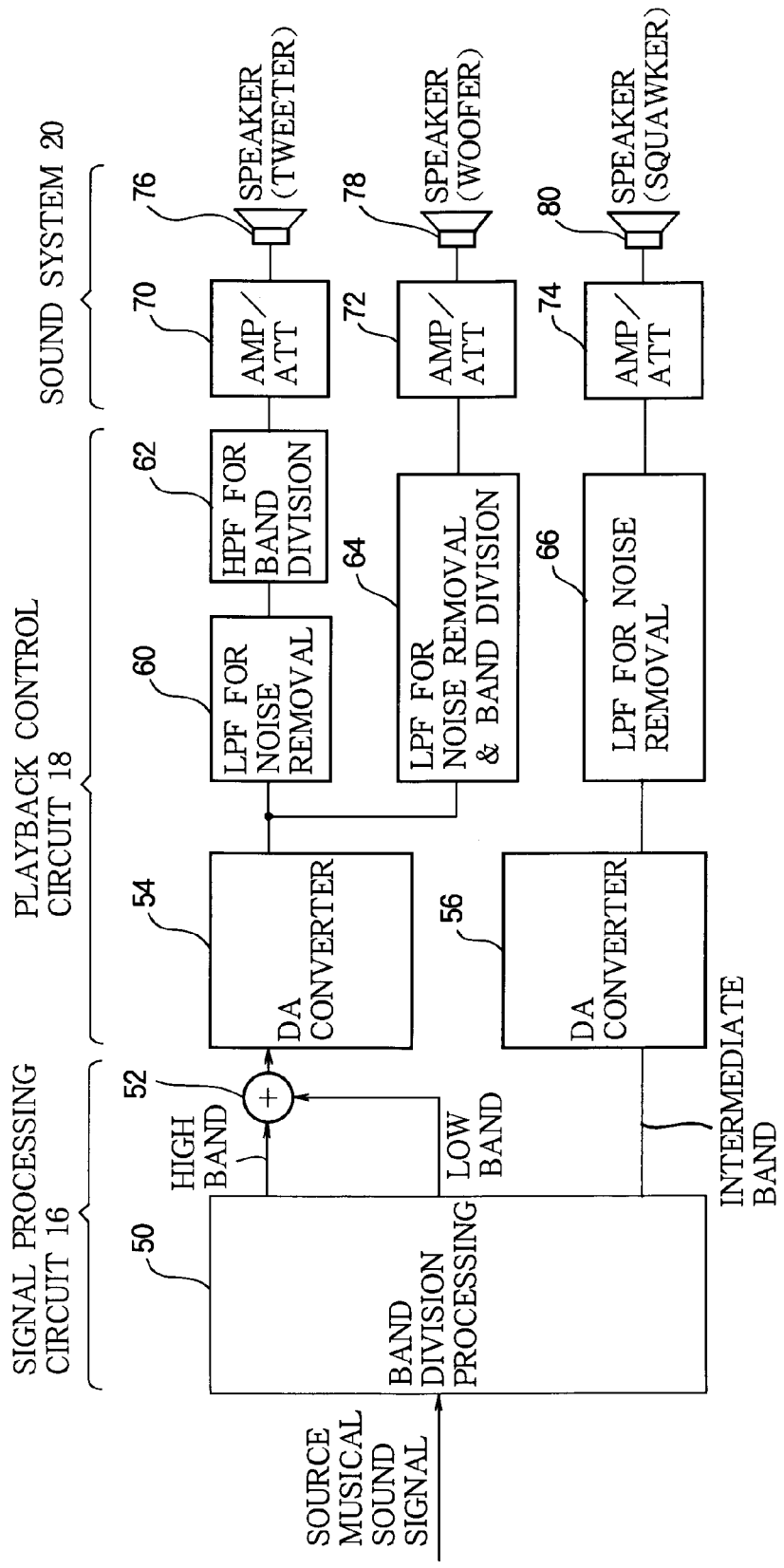
FIG. 2 is a block diagram illustrating an algorithm for band division processing in the embodiment.

Details of band division signal processing performed at the signal processing circuit 16 and the playback control circuit 18 are described below with reference to FIG. 2. FIG. 2 illustrates a configuration of one of the four speaker systems at the four locations. Since all the four speaker systems have the same configuration, the following description will be given of only the configuration of the speaker system illustrated in FIG. 2 which represents the four speaker systems. The signal processing circuit 16 performs digital signal processing as described above and implements the functions of a band division processing unit 50 and an adder 52 through its DSP and microprogram. The band division processing unit 50 includes digital filters (for example, 1st to 3rd IIR filters) and divides the source musical sound signal in frequency domain. Specifically, the band division processing unit 50 extracts low-band frequency components from the source musical sound signal (by removing intermediate-band and high-band frequency components) to generate a digital low-band signal, extracts intermediate-band frequency components from the source musical sound signal (by removing the low-band and high-band frequency components) to generate a digital intermediate-band signal, and extracts high-band frequency components from the source musical sound signal (by removing low-band and intermediate-band frequency components) to generate a digital high-band signal. That is, the band division processing unit 50 generates three types of digital signals corresponding respectively to the three bands (i.e., low-band, intermediate-band, and high-band components) from one source musical sound signal corresponding to one musical sound signal.

Here, the term "low band" refers to the lowest of the three frequency bands into which the entire frequency range of the source musical sound signal (20 Hz to 20 kHz) is divided. In addition, the term "high band" refers to the highest of the three frequency bands and the term "intermediate band" refers to the remaining frequency band, i.e., the band between the low and high bands.

Figure 4:
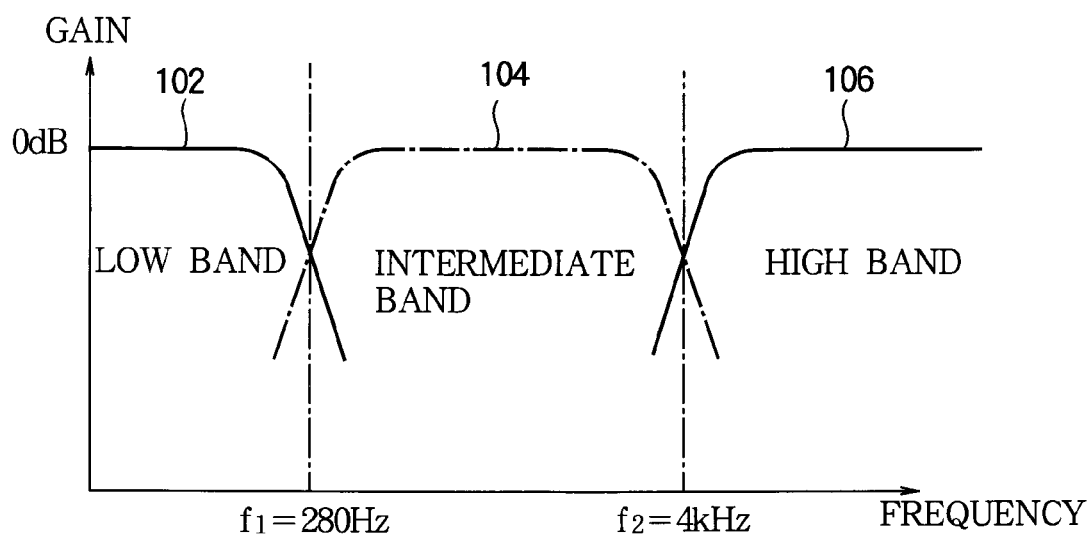
FIG. 4 illustrates filtering characteristics of filters of the band division processing unit 50.

FIG. 4 illustrates example filtering characteristics of filters for band division. In the illustrated example, the low band and the intermediate band cross over at a crossover frequency f1 (280 Hz) and the intermediate band and the high band cross over at a crossover frequency f2 (4 kHz). In this embodiment, the filtering characteristics of the filters are adjusted such that the sum of gains of the filters is about "0 dB" at any frequency included in the entire frequency range of musical sound signals which is 20 Hz to 20 kHz as described above.

Referring back to FIG. 2, reference numeral "52" denotes an adder that sums the digital low-band signal and the digital high-band signal to generate and output a digital low-high-band signal. The digital low-high-band signal is a musical sound signal that includes low-band and high-band frequency components and does not include intermediate-band frequency components among the frequency components of the entire frequency range included in the source musical sound signal, and the digital intermediate-band signal is a musical sound signal that includes intermediate-band frequency components and does not include low-band and high-band frequency components among the frequency components of the entire frequency range included in the source musical sound signal. The expression "A does not include B" used in this specification means that the magnitude of B has been sufficiently attenuated to the extent that B is actually inaudible to humans, without being limited to the meaning that B is entirely absent in A.

Reference numerals "54" and "56" denote DA converters in the playback control circuit 18, each of which converts a digital signal into an analog signal. More specifically, the DA converter 54 converts a digital low-high-band signal, which includes high-band and low-band components and does not include intermediate-band components, into an analog signal having the same frequency components, i.e., into an analog low-high-band signal which includes high-band and low-band components and does not include intermediate-band components. The DA converter 56 converts a digital intermediate-band signal, which includes intermediate-band components and does not include high-band and low-band components, into an analog signal having the same frequency components, i.e., into an analog intermediate-band signal which includes intermediate-band components and does not include high-band and low-band components. While the components of the electric piano provided upstream of the DA converters 54 and 56 perform digital signal processing as described above, all components provided downstream of the DA converters 54 and 56 perform analog signal processing since the DA converters 54 and 56 convert digital signals into analog signals. Thus, in this embodiment, it is possible to install only two DA converters 54 and 56 as described above. It is also possible to install only a single LSI chip including the two DA converters.

Reference numeral "60" denotes a Low Pass Filter (LPF) for noise removal whose cutoff frequency is 35 kHz. The following is the reason behind installation of the LPF 60 for noise removal. Generally, noise unrelated to a musical sound signal is generated when a DA converter converts a digital signal into an analog signal. This noise has components of the audio frequency band. However, using a "noise shaping" technique, it is possible to bring the frequency components of the generated noise into those exceeding the audio frequency range. Using this technique, the DA converters 54 and 56 can also bring the noise components into a band above 35 kHz.

Since the frequency components of the noise are higher than the audio frequency band, the noise is inaudible to humans. However, noise damages the human sense of hearing and causes musical sounds to sound unnatural. Therefore, an LPF for removing noise having frequency components outside the audio frequency band is essential, especially for electronic musical instruments or the like which require high quality musical sounds.

Reference numeral "62" denotes a High Pass Filter (HPF) which extracts an analog high-band signal including only high-band components by removing low-band components from the analog low-high-band signal. The cutoff frequency of the HPF 62 is set to 1.8 kHz, which is about the center of the intermediate band (280 Hz to 4 kHz as shown in FIG. 4). The HPF 62 is a first-order filter whose decay rate changes relatively slowly. Since the intermediate-band components have originally been removed from the analog low-high-band signal, it is possible to set the cutoff frequency of the HPF 62 to about the center of the intermediate band. Therefore, it is possible to sufficiently cut the low-band components off even though the first-order filter whose decay rate changes slowly is used and also to extract a high-quality analog high-band signal, despite the simple and inexpensive configuration of the filter, since the cutoff frequency 1.8 kHz is significantly distant from the crossover frequency f1 (280 Hz). The HPF 62 can be constructed at a low price not only because the configuration thereof is simple but also because parts with relatively high variation or temperature change are applicable. In summary, the HPF 62 only needs to be able to separate a low-band signal whose frequency is equal to or less than 280 Hz and a high-band signal whose frequency is equal to or higher than 4 kHz. As is understood from FIG. 4, in order to extract high-band components from the analog low-high-band signal which does not include frequency components between 280 Hz and 4 kHz (i.e., frequency components within the intermediate-band range) and which includes low and high-band components, it suffices to set the cutoff frequency within a range that is above the highest frequency of the low-band components and less than the lowest frequency of the high-band components, i.e., within the intermediate-band range. Thus, the cutoff frequency is not necessarily exactly set to 1.8 kHz and it is also permissible to set the cutoff frequency to a frequency slightly lower or higher than 1.8 kHz and therefore it is possible to apply inexpensive parts with relatively high variation or temperature change.

Reference numeral "64" denotes an LPF whose cutoff frequency is 1.8 kHz. The LPF 64 is a filter which removes both noise of frequency components outside the audio frequency range and high-band components (corresponding to an analog high-band signal) from the analog low-high-band signal to extract an analog low-band signal. That is, the LPF 64 serves as both the essential LPF, i.e., an LPF for noise removal, and an LPF for extracting an analog low-band signal from the analog low-high-band signal, by employing a cutoff frequency that accomplishes the purposes of the two LPFs. Similar to the HPF 62, in order to extract low-band components from the analog low-high-band signal which does not include frequency components between 280 Hz and 4 kHz (i.e., frequency components within the intermediate-band range) and which includes low and high-band components, it suffices to set the cutoff frequency of the LPF 64 within a range that is above the highest frequency of the low-band components and less than the lowest frequency of the high-band components, i.e., within the intermediate-band range. Thus, the cutoff frequency of the LPF 64 is not necessarily exactly set to 1.8 kHz, similar to the HPF 62.

Reference numeral "66" is an LPF which has the same configuration as the LPF 60. That is, the LPF 66 has a cutoff frequency of 35 kHz and removes noise of frequency components outside the audio frequency range from the analog intermediate-band signal. The analog intermediate-band signal includes only intermediate-band components. Therefore, if noise of frequency components outside the audio frequency range are removed, the filtered signal includes, when having directly passed through an amplifier, only intermediate-band components for output through a speaker (squawker) specialized for reproducing intermediate-band components.

Reference numerals 70, 72, and 74 denote amplifiers in the sound system 20, which amplify analog signals of the low, intermediate, and high bands while adjusting the levels of the signals. Reference numerals "76", "78", and "80" denote a tweeter, a woofer, and a squawker, which emit sounds of the high, low, and intermediate bands, respectively.

Figure 3:
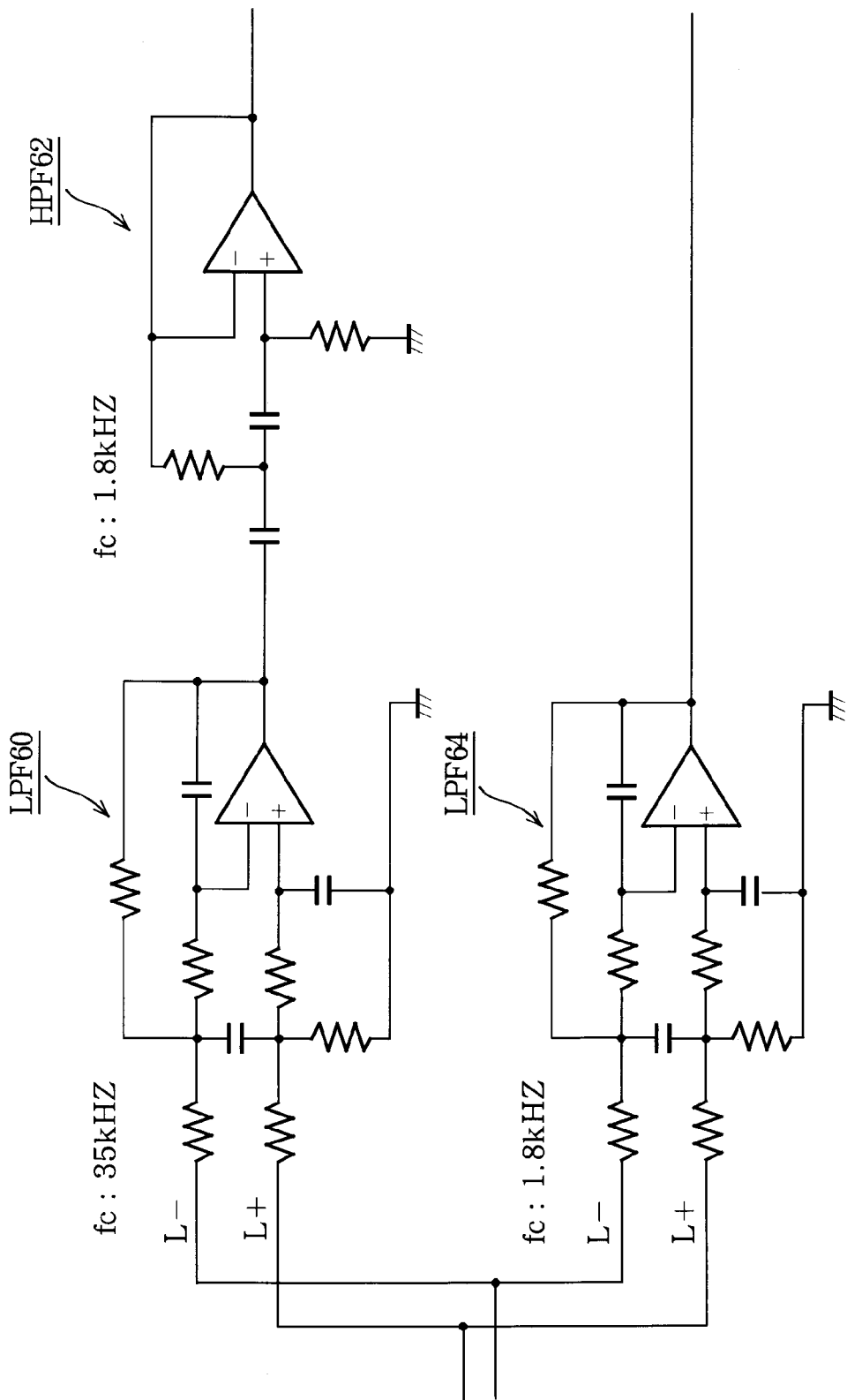
FIG. 3 is a circuit diagram of LPFs 60 and 64 and an HPF 62.

FIG. 3 is a circuit diagram of the LPFs 60 and 64 and the HPF 62. As shown, each of these filters includes one operational amplifier (op amp), a plurality of resistors, and a plurality of capacitors. The configuration of the LPF 66 is similar to that of the LPF 60 as described above.

3. Advantages of Embodiment

The advantages of this embodiment are described below in comparison with the technology of Patent Reference 1 (Japanese Patent Application Publication No. 6-54395). In the technology of Patent Reference 1, a digital musical sound signal is divided into three bands, and signals of the three bands are converted into analog signals through three DA converters. This embodiment eliminates one DA converter since it is implemented through only two DA converters. In this embodiment, although a high-band signal and a low-band signal are added through the adder 52, this does not lead to an increase in the manufacturing costs since the addition can be accomplished by slightly increasing the number of steps of the microprogram for use with the DSP. In Patent Reference 1, elements corresponding to the LPFs 60, 64, and 66 are not specifically described. However, the elements corresponding to the LPFs 60, 64, and 66 are essential in order to remove noise of frequency components outside the audio frequency range, especially, for application to electronic musical instruments or the like which require high quality musical sounds. On the other hand, in Patent Reference 1, an element corresponding to the HPF 62 of this embodiment is unnecessary since low-band and high-band signals have originally been separated.

When compared to the technology of Patent Reference 1 in terms of elements associated with manufacturing costs, this embodiment needs to add one filter (i.e., the HPF 62) although it eliminates one DA converter. However, eliminating one DA converter is very advantageous in terms of cost performance since the HPF 62 can be realized at a very low price as described above while a high sound quality DA converter is expensive. Through the combination of "elimination of one DA converter" and "addition of one HPF 62", this embodiment can realize a band division apparatus using a configuration which is very inexpensive, compared to the technology of Patent Reference 1.

4. Modifications

The invention is not limited to the above embodiment and can provide, for example, a variety of modifications as follows.

(1) In the above embodiment, the signal processing circuit 16 generates both a digital high-band signal and a digital low-band signal and the adder 52 adds the two signals to obtain a digital low-high-band signal. However, the method for obtaining the digital low-high-band signal is not limited to this method and it is possible to use any means which allows a source musical sound signal to be divided into a digital low-high-band signal and a digital intermediate-band signal at the digital stage. For example, it is also possible to obtain a digital low-high-band signal through a band removal filter for removing intermediate-band components from the source musical sound signal.

(2) Although the invention has been described with reference to examples wherein it is applied to an electric piano, the invention is not limited to the electric piano and can be applied to a variety of professional or household audio signal devices.

What is claimed is:

1. An electronic musical apparatus comprising:
a playback control circuit;
a signal processing circuit that generates a digital low-band signal, a digital intermediate-band signal, and a digital high-band signal from an input digital sound signal, wherein at least the digital low-band signal and the digital high-band signal are combined and output from the signal processing circuit as a digital low-high band signal to the playback control circuit, and the digital intermediate-band signal is output separately from the signal processing circuit to the playback control circuit,
wherein the signal processing circuit includes an adder that adds the digital low-band signal and the digital high-band signal with each other to provide the digital low-high-band signal, and
wherein the playback control circuit obtains an analog low-band signal and an analog high-band signal from the digital low-high band signal output from the signal processing circuit, and an analog intermediate band signal from the digital intermediate-band signal output from the signal processing circuit; and
a sound system including amplifiers that separately amplify the analog low-band signal, the analog intermediate-band signal, and the analog high-band signal, and speakers that emit sounds from the amplified analog low-band signal, the amplified analog intermediate-band signal, and the amplified analog high-band signal,
wherein the analog low-band signal has a low frequency band while the other frequency bands are attenuated, the analog intermediate-band signal has an intermediate frequency band while the other frequency bands are attenuated, and the analog high-band signal has a high frequency band while the other frequency bands are attenuated,
wherein the signal processing circuit includes a digital filter that separates the digital sound signal into the digital intermediate-band signal, the digital low-band signal, and the digital high-band signal, and
wherein the playback control circuit comprises:
a first DA converter that converts the digital low-high-band signal into an analog low-high-band signal;
a second DA converter that converts the digital intermediate-band signal into the analog intermediate-band signal;
a first analog filter that separates the analog low-high-band signal into the analog high-band signal; and
a second analog filter that separates the analog low-high-band signal into the analog low-band signal,
wherein the first DA converter converts the digital low-high-band signal into the analog low-high-band signal containing a noise signal of a high frequency that is higher than the high-frequency band, and
wherein the second analog filter comprises a low pass filter of a first order having a cutoff frequency that is arranged within the intermediate frequency band and obtains the analog low-band signal from the analog low-high-band signal while removing the noise signal from the analog low-high-band signal.

2. An electronic musical apparatus comprising:
a playback control circuit;
a signal processing circuit that generates a digital low-band signal, a digital intermediate-band signal, and a digital high-band signal from an input digital sound signal, wherein at least the digital low-band signal and the digital high-band signal are combined and output from the signal processing circuit as a digital low-high band signal to the playback control circuit, and the digital intermediate-band signal is output separately from the signal processing circuit to the playback control circuit,
wherein the signal processing circuit includes an adder that adds the digital low-band signal and the digital high-band signal with each other to provide the digital low-high-band signal, and
wherein the playback control circuit obtains an analog low-band signal and an analog high-band signal from the digital low-high band signal output from the signal processing circuit, and an analog intermediate band signal from the digital intermediate-band signal output from the signal processing circuit; and
a sound system including amplifiers that separately amplify the analog low-band signal, the analog intermediate-band signal, and the analog high-band signal, and speakers that emit sounds from the amplified analog low-band signal, the amplified analog intermediate-band signal, and the amplified analog high-band signal,
wherein the analog low-band signal has a low frequency band while the other frequency bands are attenuated, the analog intermediate-band signal has an intermediate frequency band while the other frequency bands are attenuated, and the analog high-band signal has a high frequency band while the other frequency bands are attenuated, wherein the signal processing circuit includes a digital filter that separates the digital sound signal into the digital intermediate-band signal, the digital low-band signal, and the digital high-band signal, and wherein the playback control circuit comprises:
- a first DA converter that converts the digital low-high-band signal into an analog low-high-band signal;
- a second DA converter that converts the digital intermediate-band signal into the analog intermediate-band signal;
- a first analog filter that separates the analog low-high-band signal into the analog high-band signal; and
- a second analog filter that separates the analog low-high-band signal into the analog low-band signal, wherein the first DA converter converts the digital low-high-band signal into the analog low-high-band signal containing a noise signal of a high frequency that is higher than the high-frequency band, wherein the second analog filter comprises a low pass filter having a cutoff frequency that is arranged within the intermediate frequency band and obtains the analog low-band signal from the analog low-high-band signal while removing the noise signal from the analog low-high-band signal, wherein the playback control circuit further includes a third analog filter that comprises a low pass filter that removes the noise signal from the analog low-high-band signal, and wherein the first analog filter comprises a high pass filter having a cutoff frequency that is arranged within the intermediate frequency band and obtains the analog high-band signal from the analog low-high-band signal after the noise signal is removed therefrom.

3. The electronic musical apparatus according to claim 2, wherein:

the second DA converter converts the digital intermediate-band signal into the analog intermediate-band signal containing a noise signal of a high frequency that is higher than the high-frequency band, and the playback control circuit further includes a fourth analog filter that comprises a low pass filter that removes the noise signal from the analog intermediate-band signal.

4. The electronic musical apparatus according to claim 2, wherein the low pass filter of the second analog filter is a low pass filter of a first order.

5. The electronic musical apparatus according to claim 2, wherein the high pass filter of the first analog filter is a high pass filter of a first order.

* * * * *